United States Patent
Matsuo et al.

(10) Patent No.: US 11,277,111 B2
(45) Date of Patent: Mar. 15, 2022

(54) VIBRATOR DEVICE, ELECTRONIC APPARATUS, AND VEHICLE

(71) Applicant: SEIKO EPSON CORPORATION, Tokyo (JP)

(72) Inventors: Atsushi Matsuo, Shiojiri (JP); Ryuta Nishizawa, Nagano (JP); Shinya Aoki, Minowa-machi (JP); Shiro Murakami, Shiojiri (JP); Masashi Shimura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 442 days.

(21) Appl. No.: 16/230,027

(22) Filed: Dec. 21, 2018

(65) Prior Publication Data

US 2019/0199317 A1 Jun. 27, 2019

(30) Foreign Application Priority Data

Dec. 26, 2017 (JP) .............................. JP2017-248837

(51) Int. Cl.
| | | |
|---|---|---|
| *H03H 9/02* | (2006.01) | |
| *H03H 9/05* | (2006.01) | |
| *H03H 9/10* | (2006.01) | |
| *H03H 9/19* | (2006.01) | |
| *H03B 5/32* | (2006.01) | |

(52) U.S. Cl.
CPC ......... *H03H 9/02133* (2013.01); *H03B 5/326* (2013.01); *H03H 9/02023* (2013.01); *H03H 9/02102* (2013.01); *H03H 9/0514* (2013.01); *H03H 9/0519* (2013.01); *H03H 9/0552* (2013.01); *H03H 9/1014* (2013.01); *H03H 9/1021* (2013.01); *H03H 9/19* (2013.01); *H03B 2200/0018* (2013.01); *H03B 2200/0022* (2013.01)

(58) Field of Classification Search
CPC .. H03H 9/132; H03H 9/02133; H03H 9/0519; H03H 9/0552; H03H 9/19; H03H 9/1021; H03H 3/04; G06F 1/1616; G06F 1/1681; G06F 1/1658
See application file for complete search history.

(56) References Cited

U.S. PATENT DOCUMENTS

| | | |
|---|---|---|
| 7,135,810 B2 | 11/2006 | Okajima |
| 7,602,107 B2 | 10/2009 | Moriya et al. |
| 2002/0180307 A1 | 12/2002 | Taga |
| 2004/0085003 A1 | 5/2004 | Miura |

(Continued)

FOREIGN PATENT DOCUMENTS

| | | |
|---|---|---|
| JP | H11-88104 A | 3/1999 |
| JP | 2001-85966 A | 3/2001 |

(Continued)

*Primary Examiner* — Jeffrey M Shin
(74) *Attorney, Agent, or Firm* — Rankin, Hill & Clark LLP

(57) ABSTRACT

A vibrator device includes a base; and a vibrator element including a quartz crystal vibrator element attached to the base via a first metal bump, in which the first metal bump is disposed on a straight line inclined within a range of +55° to +65° or −65° to −55° with respect to an X axis of the quartz crystal constituting the quartz crystal vibrator element in plan view seen from a direction in which the base and the quartz crystal vibrator element are arranged.

8 Claims, 15 Drawing Sheets

(56) References Cited

U.S. PATENT DOCUMENTS

| | | |
|---|---|---|
| 2005/0040735 A1 | 2/2005 | Okajima |
| 2006/0055479 A1 | 3/2006 | Okazaki et al. |
| 2009/0023400 A1 | 1/2009 | Nishio |
| 2009/0230486 A1 | 9/2009 | Shimodaira |
| 2011/0074515 A1* | 3/2011 | Yoshida ............... H03H 9/0519 331/155 |
| 2019/0199317 A1 | 6/2019 | Matsuo et al. |

FOREIGN PATENT DOCUMENTS

| | | |
|---|---|---|
| JP | 2002-344284 A | 11/2002 |
| JP | 2004-80068 A | 3/2004 |
| JP | 2005-102145 | 4/2005 |
| JP | 2009-239475 A | 10/2009 |
| JP | 2010-141415 A | 6/2010 |
| JP | 2010-166626 A | 7/2010 |
| JP | 2012-134792 A | 7/2012 |

* cited by examiner

VIBRATOR DEVICE, ELECTRONIC APPARATUS, AND VEHICLE

BACKGROUND

1. Technical Field

The present invention relates to a vibrator device, an electronic apparatus, and a vehicle.

2. Related Art

In the related art, for example, as disclosed in JP-A-2002-344284, a vibrator device in which a piezoelectric substrate is bonded to a package via a metal bump has been known.

In a surface acoustic wave device disclosed in JP-A-2002-344284, the metal bump is disposed in consideration of the directionality of a difference in linear expansion coefficient between the piezoelectric substrate and the package in order to reduce a stress generated in the metal bump due to temperature change.

However, in the surface acoustic wave device disclosed in JP-A-2002-344284, since a relationship between the stress sensitivity of the piezoelectric substrate and the metal bump is not considered, there is a problem in that frequency characteristics (resonance frequency) fluctuate due to the stress generated in the metal bump.

SUMMARY

An advantage of some aspects of the invention is to provide a vibrator device capable of reducing fluctuation of frequency characteristics due to a stress of a vibrator element, and to provide an electronic apparatus and a vehicle provided with the vibrator device.

The invention can be implemented as the following application examples or embodiments.

A vibrator device according to an application example includes a base; and a vibrator element including a quartz crystal vibrator element attached to the base via a first metal bump, in which the first metal bump is disposed on a straight line inclined within a range of +55° to +65° or −65° to −55° with respect to an X axis of the quartz crystal constituting the quartz crystal vibrator element in plan view seen from a direction in which the base and the quartz crystal vibrator element are arranged.

According to such a vibrator device, the first metal bump is disposed on the straight line inclined within a range of +55° to +65° or −65° to −55° with respect to the X axis of the quartz crystal constituting the quartz crystal vibrator element in plan view, and thus it is possible to reduce the fluctuations in the frequency characteristics (resonance frequency) of the vibrator element can be exhibited even if stress is generated in the element due to the difference in the linear expansion coefficient between the base and the vibrator element, and the like.

In the vibrator device according to the application example, it is preferable that the quartz crystal vibrator element is an AT-cut quartz crystal board.

With this configuration, it is possible to realize the vibrator element in which the thickness sliding vibration is excited. In addition, compared with the case of using other cut angles, there is also an advantage that temperature frequency characteristics are excellent.

In the vibrator device according to the application example, it is preferable that the quartz crystal vibrator element has an elongated shape whose longitudinal direction is the direction along a Z axis of the quartz crystal in plan view.

With this configuration, it is possible to dispose the first metal bump at the corner portion of the quartz crystal vibrator element while reducing the size of the vibrator element.

It is preferable that the vibrator device according to the application example further includes a relay board attached to the base via a second metal bump, in which the vibrator element is attached to the base via the relay board and the second metal bump, and the second metal bump is disposed on the straight line in plan view.

With this configuration, it is possible to reduce the fluctuations in the resonance frequency of the vibrator element while reducing the stress generated in the vibrator element.

It is preferable that the vibrator device according to the application example further includes a circuit element attached to the base via a third metal bump, in which the vibrator element is attached to the base via the relay board, the second metal bump, and the third metal bump, and the circuit element.

With this configuration, an oscillator can be realized. In addition, heat conduction between the vibrator element and the circuit element can be efficiently performed by the first metal bump and the second metal bump, and the temperature difference between them can be reduced. Therefore, the temperature of the vibrator element can be detected with high accuracy by using the temperature sensor in the circuit element, and temperature compensation can be performed with high accuracy.

In the vibrator device according to the application example, it is preferable that the second metal bump does not overlap the third metal bump in plan view.

With this configuration, the stress generated in the vibrator element can be further reduced.

In the vibrator device according to the application example, it is preferable that the second metal bump does not overlap the first metal bump in plan view.

With this configuration, the stress generated in the vibrator element can be further reduced.

An electronic apparatus according to an application example includes the vibrator device according to the application example.

According to such an electronic apparatus, the characteristics of the electronic apparatus can be improved by using excellent characteristics of the vibrator device.

A vehicle according to an application example includes the vibrator device according to the application example.

According to such a vehicle, the characteristics of the vehicle can be improved by using excellent characteristics of the vibrator device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
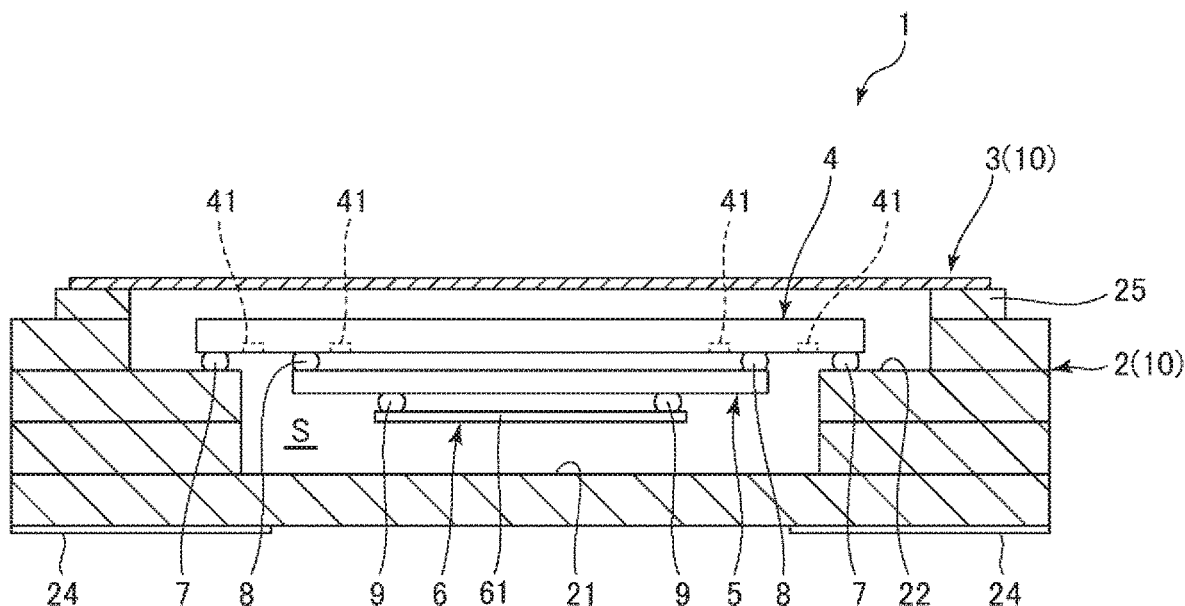
FIG. 1 is a longitudinal sectional view (a sectional view along an αγ plane) illustrating a vibrator device (oscillator) according to a first embodiment of the invention.
Figure 1:
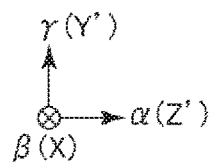

Hereinafter, a vibrator device, an electronic apparatus, and a vehicle according to the invention will be described in detail based on preferred embodiments illustrated in the drawings.

1. Vibrator Device

First Embodiment

Figure 2:
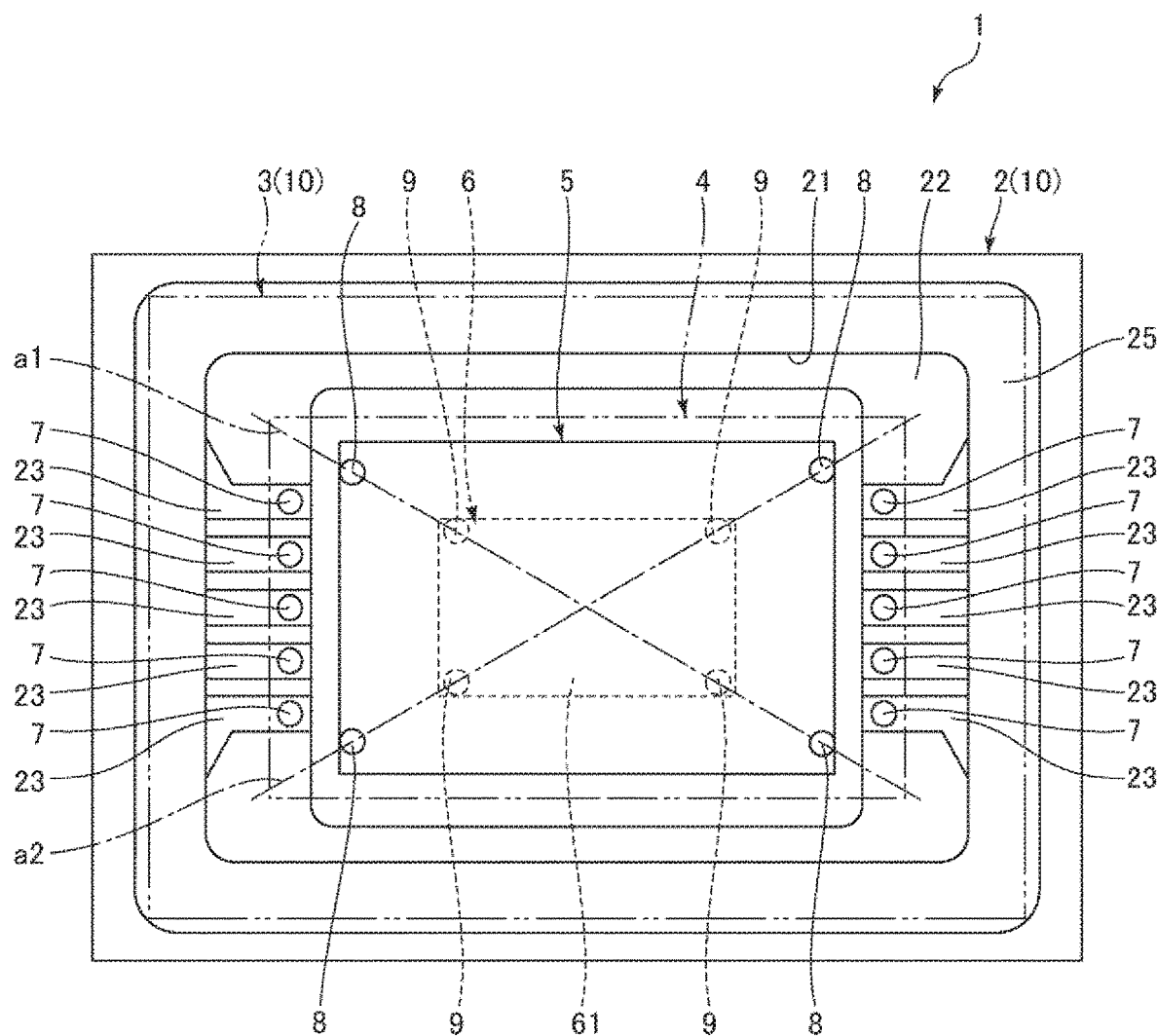
FIG. 2 is a plan view (view seen from +γ direction side) of the vibrator device as illustrated in FIG. 1.
Figure 3:
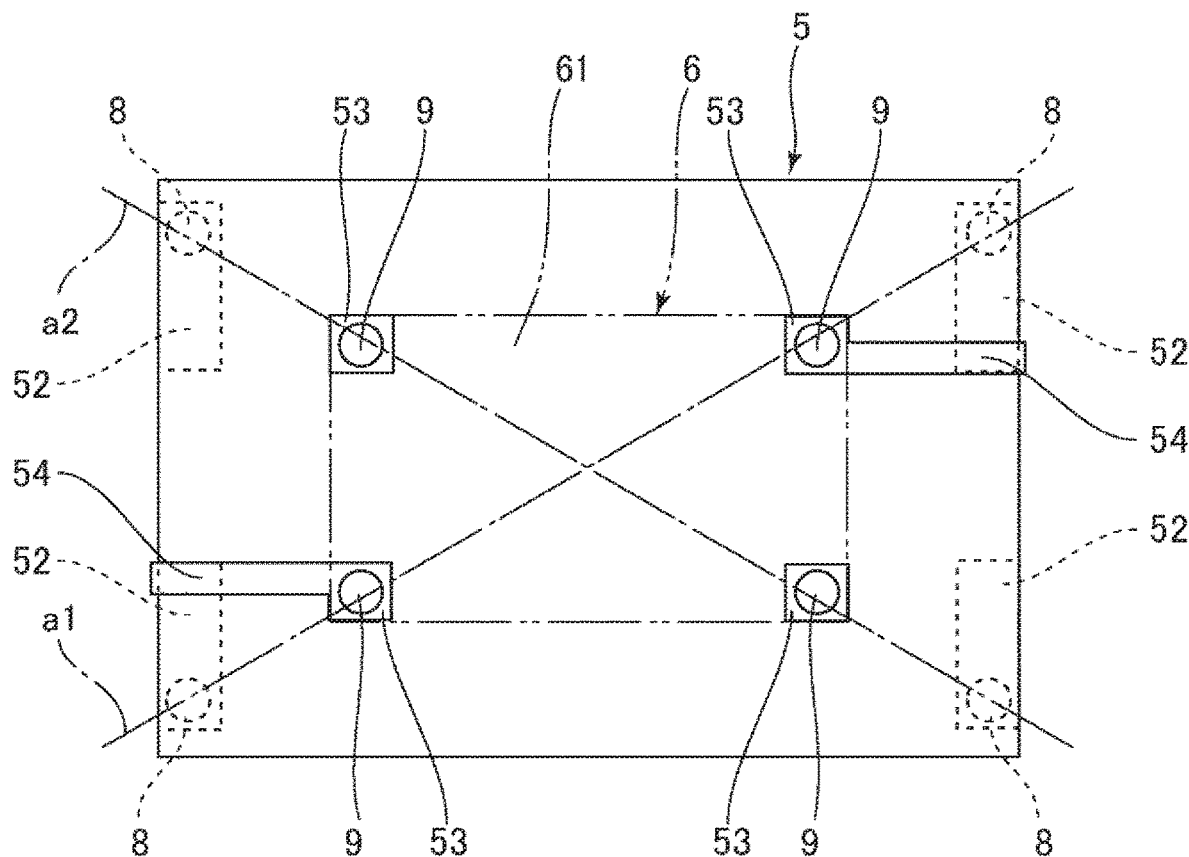
FIG. 3 is a plan view (view seen from −γ direction side) of a relay board provided with the vibrator device as illustrated in FIG. 1.
Figure 4:
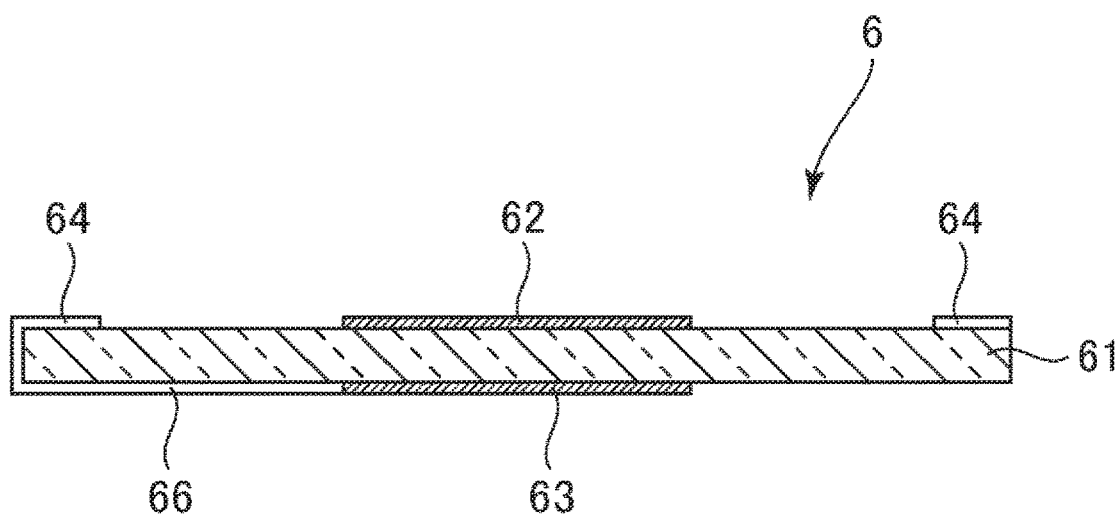
FIG. 4 is a sectional view (a sectional view along an αγ plane) of a vibrator element provided with the vibrator device as illustrated in FIG. 1.
Figure 4:
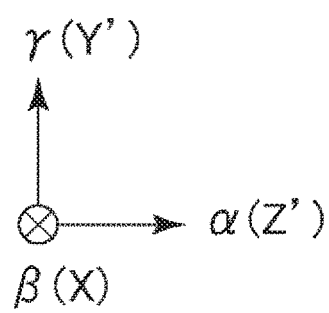
Figure 5:
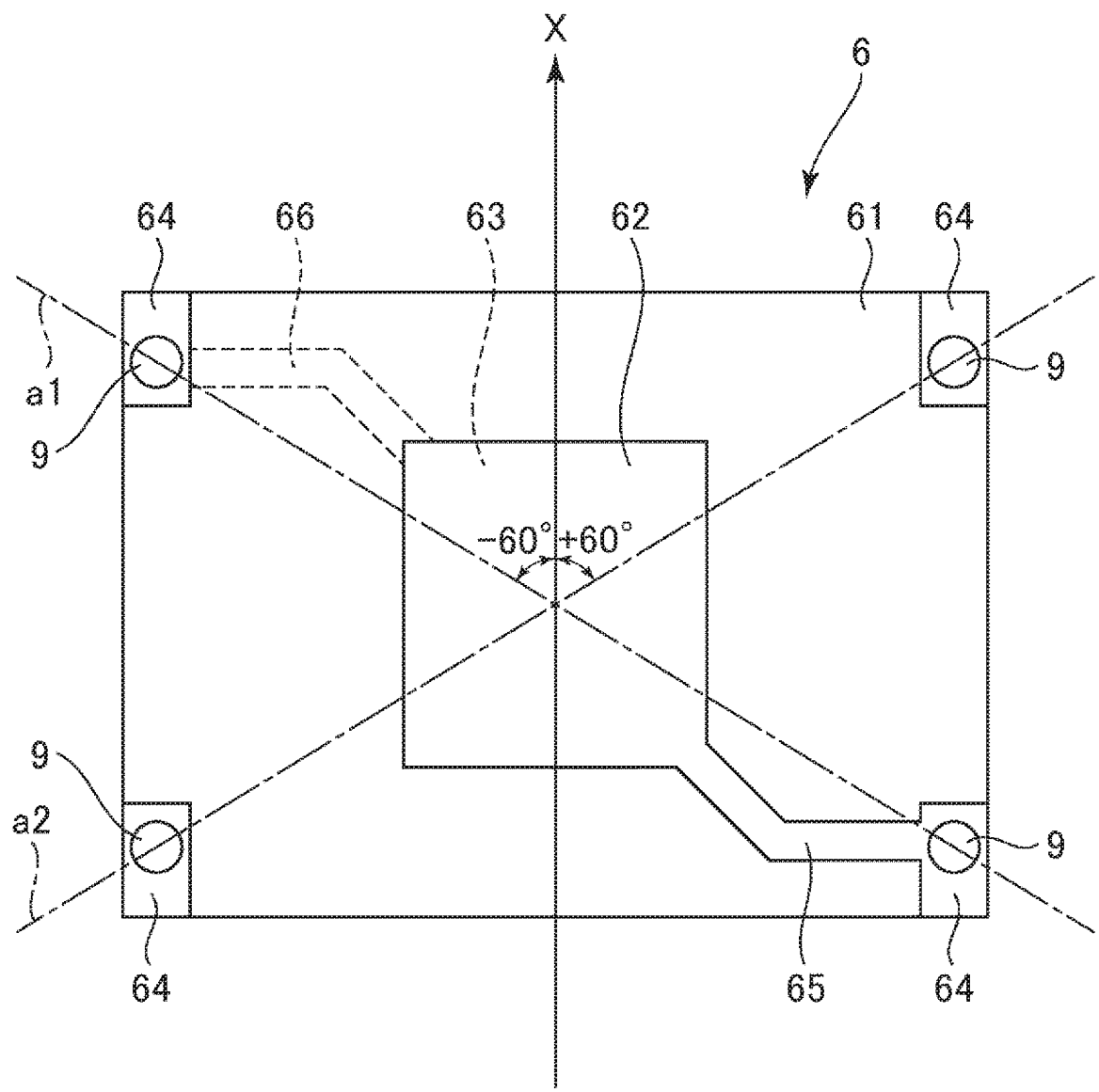
FIG. 5 is a plan view (view seen from +γ direction side) of the vibrator element as illustrated in FIG. 4.
Figure 6:
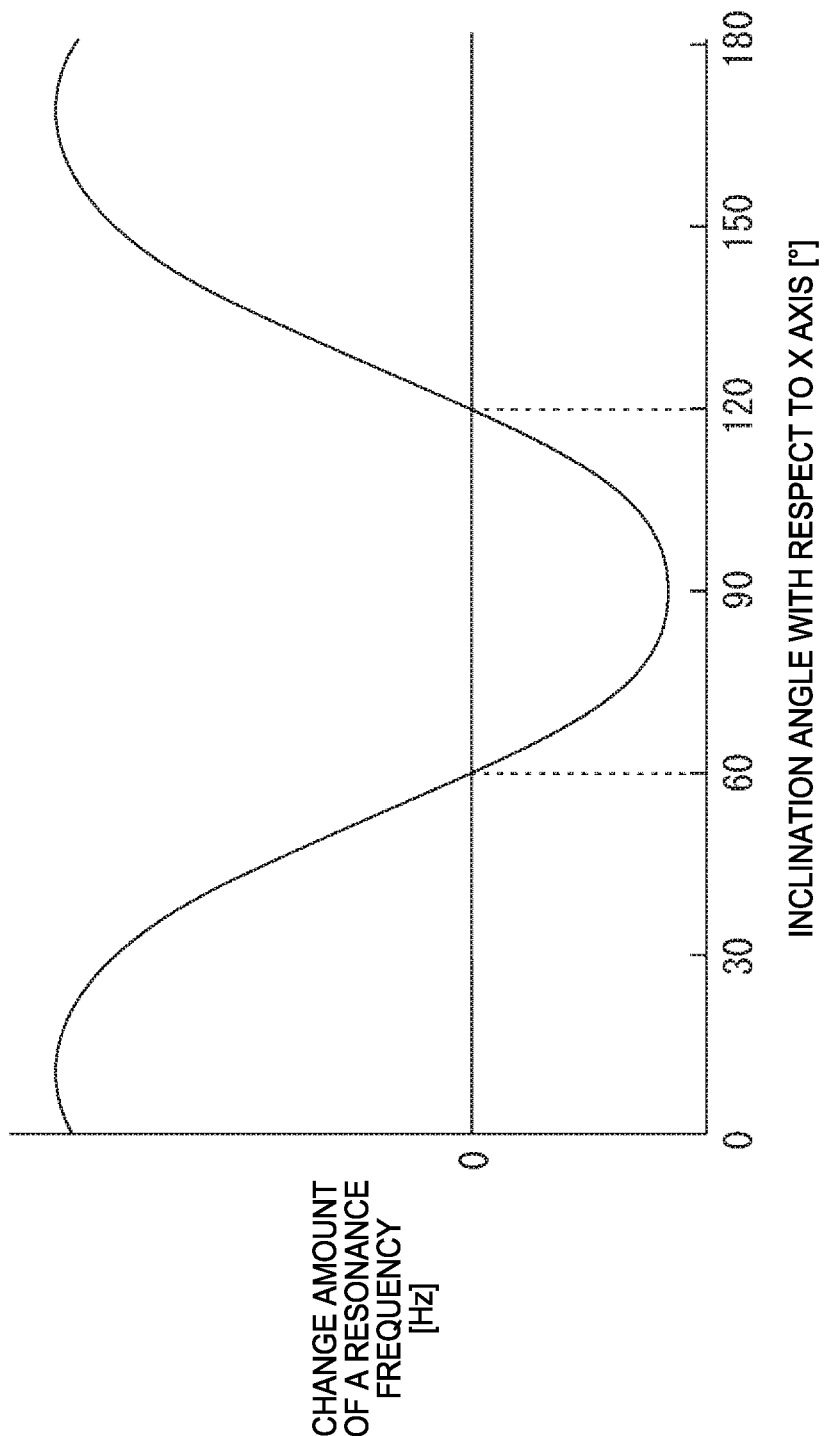
FIG. 6 is a graph illustrating a relationship between a stress direction (inclination angle with respect to an X axis) of a quartz crystal vibrator element and a change amount of a resonance frequency.

FIG. 1 is a longitudinal sectional view (a sectional view along an αγ plane) illustrating a vibrator device (oscillator) according to the first embodiment of the invention. FIG. 2 is a plan view (view seen from +γ direction side) of the vibrator device as illustrated in FIG. 1. FIG. 3 is a plan view (view seen from −γ direction side) of a relay board provided with the vibrator device as illustrated in FIG. 1. FIG. 4 is a sectional view (a sectional view along an αγ plane) of a vibrator element provided with the vibrator device as illustrated in FIG. 1. FIG. 5 is a plan view (view seen from +γ direction side) of the vibrator element as illustrated in FIG. 4. FIG. 6 is a graph illustrating a relationship between a stress direction (inclination angle with respect to an X axis) of a quartz crystal vibrator element and a change amount of a resonance frequency.

In the following description, for convenience of explanation, explanation will be made by appropriately using three axes of an α axis, a β axis, and a γ axis which are orthogonal to each other. In the following description, a direction parallel to the α axis is referred to as "α direction", a direction parallel to the β axis is referred to as "β direction", and a direction parallel to the γ axis is referred to as "γ direction". In the following description, in the drawings, the leading end side of the arrow indicating each axis of the α axis, the β axis, and the γ axis is "+" and the base end side thereof is "−". Also, the upper side (+γ direction side) in FIG. 1 is referred to as "above" and the lower side (−γ direction side) as "under". In addition, viewing from the γ direction is also referred to as "plan view". Further, in FIG. 2, for the sake of convenience of the explanation, the interior of a base 2 is illustrated through a lid 3 and a circuit element 4 in a transparent manner.

A vibrator device 1 illustrated in FIG. 1 is a quartz crystal oscillator. The vibrator device 1 is provided with a base 2 (base body), a lid 3, a circuit element 4, a relay board 5, a vibrator element 6, metal bumps 7, 8, and 9.

Here, the base 2 and the lid 3 constitute a package 10 having a space S storing the circuit element 4, the relay board 5, and the vibrator element 6. In the space S of this package 10, the circuit element 4, the relay board 5, and the vibrator element 6 are arranged (stacked) in this order from the +γ direction side to the −γ direction side.

The metal bump 7 (third metal bump) bonds the base 2 and the circuit element 4, and the circuit element 4 is attached to the base 2 via the metal bump 7. The metal bump 8 (second metal bump) bonds the circuit element 4 and the relay board 5, and the relay board 5 is attached to the circuit element 4 via the metal bump 8. The metal bump 9 (first metal bump) bonds the relay board 5 and the vibrator element 6, and the vibrator element 6 is attached to the relay board 5 via the metal bump 9.

Further, the metal bumps 9 are arranged on straight lines a1 and a2 in plan view. In this embodiment, the metal bumps 8 are arranged on the straight lines a1 and a2 in plan view. The straight line a1 is a straight virtual line segment inclined within a range of −65° to −55° (within a range of 55° to 65° in a counterclockwise direction when viewed from +Y' axis direction side) with respect to the X axis, which is one of the crystal axes of quartz crystal constituting the quartz crystal vibrator element 61 (to be described later) of the vibrator element 6 in plan view. The straight line a2 is a straight virtual line segment inclined within a range of +55° to +65° (within a range of 55° to 65° in a clockwise direction when viewed from +Y' axis direction side) with respect to the X axis, which is one of the crystal axes of quartz crystal constituting the quartz crystal vibrator element 61 (to be described later) of the vibrator element 6 in plan view. In the drawing, the inclination angles of the straight lines a1 and a2 with respect to the X axis of the quartz crystal in plan view are −60° or +60°, respectively.

As described above, in the vibrator device 1, the metal bumps 9 are arranged on the straight lines a1 and a2 in plan view, and thus an effect of reducing fluctuations in the resonance frequency of the vibrator element 6 can be exhibited even if stress is generated in the vibrator element 6 due to the difference in the linear expansion coefficient between the base 2 and the vibrator element 6, and the like. In this embodiment, since the metal bumps 8 are also arranged on the straight lines a1 and a2 in plan view, the effect becomes more remarkable. Hereinafter, each part of such a vibrator device 1 will be described.

Package

The package 10 includes a box-shaped base 2 having a recessed portion 21 opening to a top surface and a plate-shaped lid 3 bonded to the base 2 and closing an opening (upper opening) of the recessed portion 21, and forms the space S between the base 2 and the lid 3 as an airtight space for storing the circuit element 4, the relay board 5, and the vibrator element 6. This space S may be in a depressurized (vacuum) state or an inert gas such as nitrogen, helium, or argon may be sealed.

The constituent material of the base 2 is not particularly limited, and a material that has insulating properties and is suitable for making the space S an airtight space can be used. Examples thereof include various ceramics such as oxide ceramics such as alumina, silica, titania, and zirconia, nitride ceramics such as silicon nitride, aluminum nitride, and titanium nitride, and carbide ceramics such as silicon carbide.

The base 2 has a stepped portion 22 provided so as to surround the outer periphery of the bottom surface of the recessed portion 21 above the bottom surface of the recessed portion 21. As illustrated in FIG. 2, a plurality (ten in the drawing) of connecting electrodes 23 to be electrically connected to the circuit element 4 are provided on the upper surface of the stepped portion 22. These connecting electrodes 23 are electrically connected to a plurality of external mounting electrodes 24 (refer to FIG. 1) provided on the lower surface of the base 2 via through electrodes (not shown) penetrating the base 2, respectively.

The constituent materials of the connecting electrodes 23, the external mounting electrode 24, and the through electrode are not particularly limited, and examples thereof include metallic materials such as gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti) cobalt (Co), zinc (Zn), and zirconium (Zr).

On an upper end surface of such a base 2, a frame-like (annular) seal ring 25 is provided. The seal ring 25 is made of a metallic material such as Kovar, and is bonded to the base 2 by brazing or the like. The lid 3 is bonded to the base 2 through such a seal ring 25 by seam welding or the like. The constituent material of the lid 3 is not particularly limited, and a metallic material is preferably used, and among them, it is preferable to use a metallic material having a linear expansion coefficient close to that of the constituent material of the base 2. Therefore, for example, in a case where the base 2 is a ceramic substrate, it is preferable to use an alloy such as Kovar as the constituent material of the lid 3.

Circuit Element

The circuit element 4 is an integrated circuit element having a function of driving the vibrator element 6 to oscillate and a function (temperature compensation function) of correcting the frequency-temperature characteristics of the oscillation frequency. The circuit element 4 includes a plurality of temperature sensors 41, a drive circuit (not shown), and a temperature-compensated circuit (not shown). Here, in the circuit element 4, the drive circuit drives the vibrator element 6 to oscillate the vibrator element 6 and output a signal of a desired frequency. Further, the temperature-compensated circuit corrects the frequency-temperature characteristic of the output signal of the circuit element 4 according to the output signal of the temperature sensor 41.

On a lower surface (the lower surface in FIG. 1), which is an active surface of the circuit element 4, a plurality of first terminals (not shown) for connecting to the plurality of connecting electrodes 23 of the base 2, and a plurality of second terminals (not shown) for connecting to the relay board 5 are provided. Each of the plurality of first terminals is provided corresponding to the connecting electrode 23 and is bonded to the corresponding connecting electrode 23 via the metal bump 7. As a result, the circuit element 4 is supported by the base 2, and the circuit element 4 and the base 2 are electrically connected to each other. In addition, the plurality of second terminals include terminals electrically connected to a pair of excitation electrodes (pad electrodes) of a later-described vibrator element 6 via the relay board 5, and each of the second terminals is bonded to the relay board 5 via the metal bump 8. As a result, the relay board 5 is supported by the circuit element 4, and the circuit element 4 and the relay board 5 are electrically connected to each other.

The plurality of temperature sensors 41 are arranged at different positions of the circuit element 4 in plan view. This makes it possible to detect the temperature distribution in the in-plane direction of the circuit element 4 by using the plurality of temperature sensors 41. Here, the plurality of temperature sensors 41 are arranged on the lower surface (the active surface) side of the circuit element 4. A temperature sensor 41 may be provided on the upper surface (a surface opposite to the active surface) of the circuit element 4. In this case, for example, a thin film thermistor may be used as the temperature sensor 41.

The plurality of temperature sensors 41 are provided corresponding to the above-described plurality of metal bumps 7 and 8 described above. In order to detect the temperature of the corresponding metal bumps 7 and 8, each of the temperature sensors 41 is disposed in the vicinity of the corresponding metal bumps 7 and 8 (position closer than a metal bump other than the corresponding metal bumps 7 and 8).

Note that, the arrangement of the temperature sensors 41 illustrated in the drawing is merely an example, and the invention is not limited thereto. For example, in the drawing, the temperature sensors 41 are arranged so as not to overlap with the corresponding metal bumps 7 and 8 in plan view, but may be arranged so as to overlap with the corresponding metal bumps 7 and 8. In addition, it suffices that the number of temperature sensors 41 included in the circuit element 4 is optional, and a part of the plurality of temperature sensors 41 described above may not be provided, and another temperature sensor may be added to the circuit element 4.

Relay Board

As illustrated in FIG. 1, the relay board 5 is bonded to the lower surface (the surface on the −y direction side) of the circuit element 4 by a plurality of the metal bumps 8. The vibrator element 6 is bonded to the surface of the relay board 5 on the side opposite to the circuit element 4 via a metal bump 9. In this manner, the relay board 5 is interposed between the circuit element 4 and the vibrator element 6. With this, the relay board 5 has a function of reducing the stress generated in the vibrator element 6 due to the difference in the linear expansion coefficient between the circuit element 4 and the vibrator element 6.

The relay board 5 is a quadrangle whose longitudinal direction is the α direction in plan view. The shape of the relay board 5 in plan view is not limited to the shape illustrated in the drawings. For example, the external shape of the relay board 5 in plan view is not limited to a quadrangle, it may be a polygon other than the quadrangle, or at least one hole or a recessed portion may be provided in the relay board 5. Further, the relay board 5 may have a shape in which a part to which the metal bump 8 is bonded and a part to which the metal bump 9 is bonded are connected to each other via a part having a spring property so that the position or posture thereof is easily changed.

Although the constituent material of the relay board 5 is not particularly limited, it is preferable to use a material having a linear expansion coefficient close to that of the constituent material of the quartz crystal vibrator element 61 of the vibrator element 6 described later, specifically, it is preferable to use quartz crystal. With this, it is possible to reduce the stress generated in the vibrator element 6 due to the difference in the linear expansion coefficient between the relay board 5 and the vibrator element 6. Particularly, it is preferable that the relay board 5 is formed of a Z-cut quartz crystal board or an AT-cut quartz crystal board.

The Z-cut quartz crystal board is a quartz crystal substrate which has a spread in a XY plane defined by the Y axis (machine axis) and the X axis (electric axis) which are the quartz crystal axes of the quartz crystal substrate, and is in a form of a plate having a thickness in the direction of the Z axis (optical axis). When the relay board 5 is formed of the Z-cut quartz crystal board, it is possible to easily obtain the relay board 5 having high dimensional accuracy by wet etching. Note that, the Z-cut quartz crystal board includes a quartz crystal board having a cut angle such that the plane orthogonal to the Z axis is rotated in a range of 0 to 10 degrees around at least one of the X axis and the Y axis as the principal plane.

An AT-cut quartz crystal board is a rotated Y-cut quartz crystal substrate cut along a plane obtained by rotating the XZ plane (a plane orthogonal to the Y axis) around the X axis by 35° 15'. In a case where the relay board 5 is formed of an AT-cut quartz crystal board, it is preferable that in plan view, the X axis of the quartz crystal constituting the relay board 5 is set to be parallel to the X axis of the quartz crystal constituting the quartz crystal vibrator element 61 of the vibrator element 6, or set to be directed in a direction rotated by 180°. With this, the metal bumps 8 can be arranged on a straight line inclined within a range of +55° to +65° or −65° to −55° with respect to the X axis of the quartz crystal constituting the relay board 5 in plan view. Therefore, even if the stress is generated in the relay board 5 due to the difference in the linear expansion coefficient between the circuit element 4 and the relay board 5, the fluctuations in the resonance frequency of the relay board 5 is reduced, and eventually the fluctuations in the resonance frequency of the vibrator element 6 can be further reduced.

The thickness of the relay board 5 varies depending on the shape of the relay board 5 in plan view, and is not particularly limited, but is preferably larger than the thickness of the vibrator element 6 and smaller than the thickness of the circuit element 4. More specifically, it is preferably 1.5 times or more the thickness of the vibrator element 6 and 0.8 times or less the thickness of the circuit element 4. Thereby, the stress generated in the vibrator element 6 can be suitably reduced.

In addition, a plurality (four in the drawing) of terminals 52, a plurality (four in the drawing) of terminals 53, and a plurality (two in the drawing) of wirings 54 are arranged on the relay board 5.

The plurality of terminals 52 are arranged on one surface of the relay board 5 (the back side in FIG. 3). The terminal 52 is disposed at each corner of the relay board 5 so that the metal bump 8 can be disposed at a position overlapping the line segments a1 and a2 described later in plan view. The metal bumps 8 are bonded to the plurality of terminals 52, respectively. On the other hand, the plurality of terminals 53 are arranged on the other surface of the relay board 5 (the back side in FIG. 3). The terminal 53 is disposed so that the metal bump 9 can be disposed at a position overlapping the line segments a1 and a2 described later in plan view. The metal bumps 9 are bonded to the plurality of terminals 53, respectively. Two terminals 53 positioned diagonally among the plurality of terminals 53 are connected to two terminals 52 positioned diagonally among the plurality of terminals 52 via two wirings 54. Note that the shapes of the terminals 52 and 53 and the wiring 54 are merely examples and are not limited to the illustrated shapes.

Such terminals 52 and 53 and wiring 54 enable necessary conduction between the circuit element 4 and the vibrator element 6. Further, the terminals 52 and 53 and the wiring 54 have a function of enhancing heat conduction between the circuit element 4 and the vibrator element 6. From such a functional viewpoint, it is preferable to increase the area of the terminals 52 and 53 and the wiring 54 as much as possible as long as the above-described necessary conduction is possible. A known electrode material can be used as the constituent material of the terminals 52 and 53, and the wiring 54, and the constituent material is not particularly limited. For example, as in the case of the excitation electrodes 62 and 63 and the like of the vibrator element 6 described later, metal such as Cr (chromium), Ni (nickel), Au (gold), and Al (aluminum), and alloys thereof.

Vibrator Element

The vibrator element 6 is an element that excites thickness sliding vibration. As illustrated in FIGS. 4 and 5, the vibrator element 6 includes the quartz crystal vibrator element 61, a pair of the excitation electrodes 62 and 63 disposed on both surfaces of the quartz crystal vibrator element 61, four pad electrodes 64 arranged on one surface (upper surface) of the quartz crystal vibrator element 61, and wirings 65 and 66 connected to the pair of excitation electrodes 62 and 63 and two pad electrodes 64. In the vibrator element 6, when a periodically changing voltage is applied between the pair of excitation electrodes 62 and 63 through the two pad electrodes 64, thickness sliding vibration is excited at a desired frequency in a predetermined portion of the quartz crystal vibrator element 61.

Here, the quartz crystal belongs to the trigonal system and has an X axis, a Y axis and a Z axis orthogonal to each other as crystal axes. The X axis, the Y axis, and the Z axis are referred to as an electric axis, a mechanical axis, and an optical axis, respectively. The quartz crystal vibrator element 61 is a "rotated Y-cut quartz crystal substrate" cut along a plane obtained by rotating the XZ plane (a plane orthogonal to the Y axis) around the X axis by a predetermined angle θ. By using an AT-cut quartz crystal substrate which is a rotated Y-cut quartz crystal substrate of θ=35° 15' as the quartz crystal vibrator element 61, the vibrator element 6 having excellent temperature characteristics is obtained. Note that, the quartz crystal vibrator element 61 is not limited to the AT-cut quartz crystal substrate as long as it can excite thickness shear vibration, and for example, a BT cut or SC cut quartz crystal substrate may be used.

The Y axis and the Z axis rotated about the X axis by the angle θ are defined as a Y' axis and a Z' axis, respectively. The quartz crystal vibrator element 61 has a plate shape having a spread on the XZ' plane (a plane orthogonal to the Y' axis) and a thickness in a direction parallel to the Y' axis. In the following description, a direction parallel to the X axis is referred to as "X axis direction", a direction parallel to the Y' axis is referred to as "Y' axis direction", and a direction parallel to the Z' axis is referred to as "Z' axis direction".

In this embodiment, the quartz crystal constituting the quartz crystal vibrator element 61 has an X axis parallel to the β axis, the Y' axis parallel to the γ direction, and the Z' axis parallel to the α direction. The quartz crystal vibrator element 61 has a rectangular shape whose longitudinal direction is the α direction (Z' axis direction) in plan view. The shape of the vibrator element 6 in plan view is not limited to the above-described shape as long as it has a shape obtained by chamfering one corner of a circle or rectangle shape. Although the thickness of the vibrator element 6 is constant in the drawing, it is not limited thereto, and it may be, for example, a so-called mesa type or an inverted mesa type (refer to third embodiment).

The excitation electrode 62 is disposed on one surface (the upper side in FIG. 4) of the quartz crystal vibrator element 61 described above, whereas the excitation electrode 63 is disposed on the other surface (lower side in FIG. 4) of the quartz crystal vibrator element 61. As a result, an electric field in the thickness direction of the quartz crystal vibrator element 61 can be generated between the excitation electrodes 62 and 63 so as to excite the thickness sliding vibration in the quartz crystal vibrator element 61.

The plurality of pad electrodes 64 are arranged on one surface of the quartz crystal vibrator element 61 (the upper side in FIG. 4, and the front side of the paper surface in FIG. 5). The pad electrode 64 is disposed at each corner portion of the quartz crystal vibrator element 61. The metal bumps 9 are bonded to the plurality of pad electrodes 64, respectively. Regarding two pad electrodes 64 which are diagonally positioned of the plurality of pad electrodes 64, one pad electrode 64 (the pad electrode 64 at the lower right in FIG. 5) is connected to the excitation electrode 62 via the wiring 65, and the other pad electrode 64 (the pad electrode 64 at the upper left in FIG. 5) is connected to the excitation electrode 63 via the wiring 66.

As the structure of the excitation electrodes 62 and 63, the pad electrode 64, and the wirings 65 and 66, a known electrode material can be used, but it is not particularly limited thereto. For example, it is possible to use metal such as Au (gold) and Al (aluminum) or an alloy containing Au and Al as a main component on a base layer such as Cr (chromium) or Ni (nickel).

Metal Bump

The metal bump 7 (third metal bump) bonds the base (the package 10) and the circuit element 4 to each other. With this, it possible to smoothly transfer heat between the base 2 and the circuit element 4, and as a result, it is possible to reduce the temperature difference between them. The metal bump 8 (second metal bump) bonds the circuit element 4 and relay board 5 to each other. With this, it possible to smoothly transfer heat between the circuit element 4 and the relay board 5, and as a result, it is possible to reduce the temperature difference between them. The metal bump 9 (first metal bump) bonds the relay board 5 and the vibrator element 6 to each other. With this, it possible to smoothly transfer heat between the relay board 5 and the vibrator element 6, and as a result, it is possible to reduce the temperature difference between them.

In this way, when the metal bumps 7, 8, and 9 are used, it is possible to mount the vibrator element 6 and the circuit element 4 on the package 10 without using a resin material. Therefore, even if a heat treatment is performed after the package 10 is sealed, it is possible to solve the problem caused by the gas (out gas) generated from the resin material in the package 10. Since the temperature difference between the relay board 5 and the vibrator element 6 can be reduced as described above, it is possible to detect the temperature of the vibrator element 6 with high accuracy or high sensitivity using the temperature sensor 41 of the circuit element 4, and thereby, it is possible to perform temperature compensation with high accuracy.

Each of the metal bumps 7, 8, and 9 has a circular shape in plan view. The shapes of the metal bumps 7, 8, and 9 are not limited to the shapes illustrated in the drawings, and may be, for example, a columnar shape, a polygonal columnar shape, or a circular truncated conical shape. The constituent materials of the metal bumps 7, 8, and 9 are not particularly limited, and examples thereof include metals such as gold (Au), silver (Ag), copper (Cu), aluminum (Al), and platinum (Pt), and an alloy thereof, a lead-free solder, a leaded solder, and the like. Each of the metal bumps 7, 8, and 9 can be formed by, for example, a plating method, a bonding method, or the like, and the bonding can be performed by pressure welding, heat pressing, or ultrasonic combined heating pressure welding or the like.

The quartz crystal vibrator element 61 has a stress sensitivity (change characteristic of the resonance frequency with respect to the direction of the stress) as described in FIG. 6. That is, when the direction of the stress generated in the quartz crystal vibrator element 61 is orthogonal to the Y′ axis and is +60° and +120° (equivalent to −60°) with respect to the X axis, the amount of change in the resonance frequency of the quartz crystal vibrator element 61 due to the stress can be reduced to zero.

Here, it is considered that the amount of change in the resonance frequency due to the stress of the quartz crystal vibrator is preferably within 30 ppm, but the angle at which the direction of the stress generated in the quartz crystal vibrator element 61 corresponding to such amount of change is inclined with respect to the X axis is 60°±5°. In this embodiment, among the metal bumps 7, 8, and 9, the metal bumps 8 and 9 are arranged on the straight lines a1 and a2 inclined within a range of +55° to +65° or −65° to −55° with respect to the X axis of the quartz crystal constituting the quartz crystal vibrator element 61 of the above-described vibrator element 6.

Therefore, even when the stress is applied to the quartz crystal vibrator element 61 via two metal bumps 8 and 9 on the straight line a1 in plan view, fluctuations in the resonance frequency of the quartz crystal vibrator element 61 can be reduced. Similarly, even when the stress is applied to the quartz crystal vibrator element 61 via two metal bumps 8 and 9 on the straight line a2 in plan view, the fluctuations in the resonance frequency of the quartz crystal vibrator element 61 can be reduced.

As described above, the vibrator device 1 is provided with a vibrator element 6 including the base 2 and quartz crystal vibrator element 61 attached to the base 2 via the metal bump 9 (the first metal bump). The metal bumps 9 are arranged on the straight lines a1 and a2 inclined within a range of +55° to +65° or −65° to −55° with respect to the X axis of the quartz crystal constituting the quartz crystal vibrator element 61 in plan view seen from the direction in which the base 2 and the quartz crystal vibrator element 61 are arranged.

According to the vibrator device 1, the metal bumps 9 are arranged on the straight lines a1 and a2 inclined within a range of +55° to +65° or −65° to −55° with respect to the X axis of the quartz crystal constituting the quartz crystal vibrator element 61 in plan view, and thus it is possible to reduce the fluctuations in the resonance frequency of the vibrator element 6 can be exhibited even if stress is generated in the vibrator element 6 due to the difference in the linear expansion coefficient between the base 2 and the vibrator element 6, and the like. Here, from the characteristics described in FIG. 6, the inclination angle of the straight line a1 with respect to the X axis of the quartz crystal in plan view is preferably −60°, and similarly, the inclination angle of the straight line a2 with respect to the X axis of the quartz crystal is preferably +60°. In this embodiment, two metal bumps 9 are arranged on the respective straight lines a1 and a2 in plan view, and these two metal bumps 9 may be arranged on one of the straight lines a1 and a2 in plan view so as to partially overlap with each other.

Here, the quartz crystal vibrator element 61 is preferably an AT-cut quartz crystal board. With this, it is possible to realize the vibrator element 6 in which the thickness sliding vibration is excited. In addition, compared with the case of using other cut angles, there is also an advantage that temperature frequency characteristics are excellent.

In addition, the quartz crystal vibrator element 61 has an elongated shape whose longitudinal direction is the direction along the Z axis of the quartz crystal of the quartz crystal vibrator element 61 in plan view. With this, it is possible to arrange the metal bumps 9 at the corner portion of the quartz crystal vibrator element 61 while reducing the size of the vibrator element 6.

The vibrator device 1 of this embodiment is provided with the relay board 5 attached to the base 2 via the metal bump 8 (the second metal bump). In addition, the vibrator element 6 is attached to the base 2 via the relay board 5 and the metal bump 8. Particularly, the metal bumps 8 are arranged on straight lines a1 and a2 in plan view. With this, it is possible to reduce the fluctuations in the resonance frequency of the vibrator element 6 while reducing the stress generated in the vibrator element 6.

Also, the vibrator device 1 includes the circuit element 4 attached to the base 2 via the metal bump 7 (the third metal bump). The vibrator element 6 is attached to the base 2 via the relay board 5, the metal bump 8 (the second metal bump), the metal bump 7, and the circuit element 4. With this, it is possible to realize the vibrator device 1 which is an oscillator. In addition, heat conduction between the vibrator element 6 and the circuit element 4 can be efficiently performed by the metal bump 8 and the metal bump 9, and the temperature difference between them can be reduced. Therefore, the temperature of the vibrator element 6 can be detected with high accuracy by using the temperature sensor 41 in the circuit element 4, and temperature compensation can be performed with high accuracy.

Here, the metal bump 8 (the second metal bump) does not overlap the metal bump 7 (the third metal bump) in plan view. With this, the force transmission path between the circuit element 4 and the relay board 5 can be lengthened, and as a result, the stress generated in the vibrator element 6 can be further reduced.

In addition, the metal bump 8 (the second metal bump) does not overlap the metal bump 9 (the first metal bump) in plan view. With this, the force transmission path between the relay board 5 and the vibrator element 6 can be lengthened, and as a result, the stress generated in the vibrator element 6 can be further reduced.

Second Embodiment

Next, a second embodiment of the invention will be described.

Figure 7:
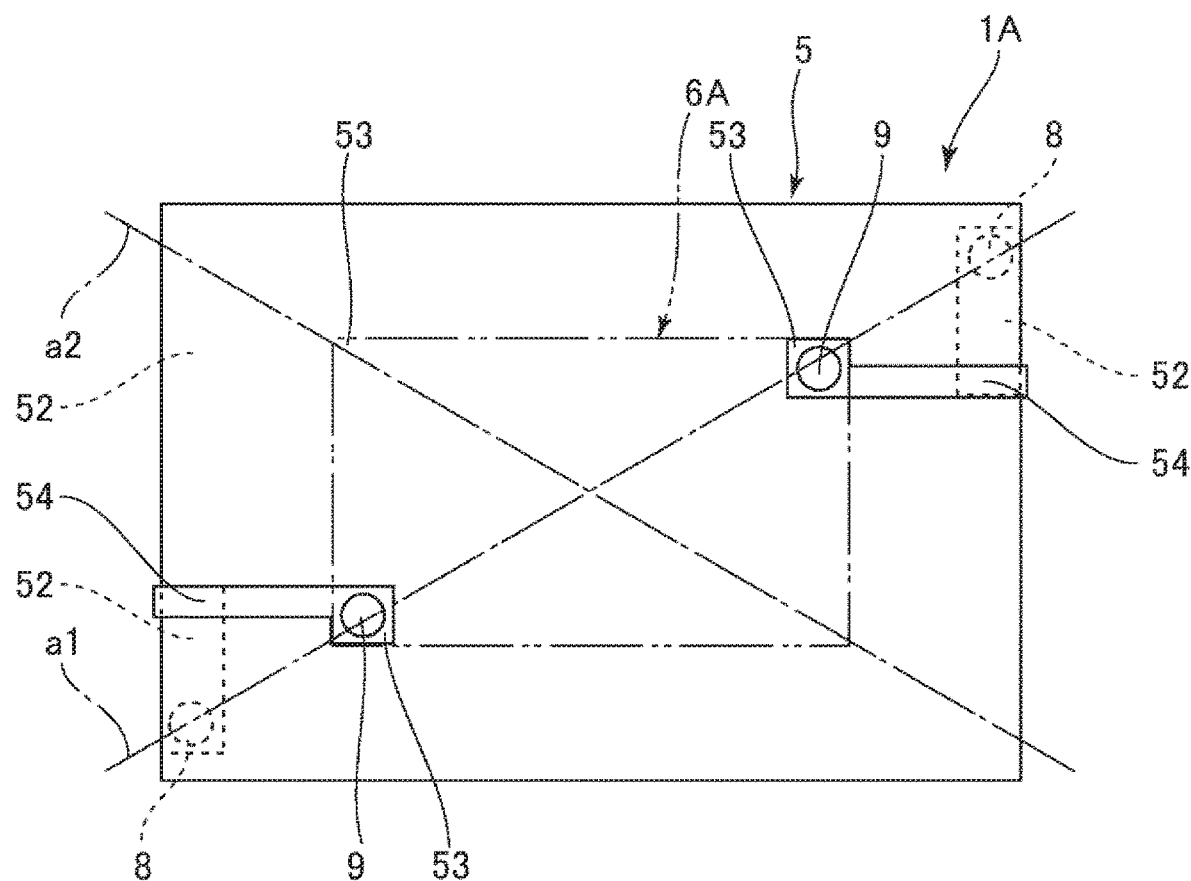
FIG. 7 is a plan view (view seen from −γ direction side) of a relay board provided in the vibrator device according to the second embodiment of the invention.
Figure 8:
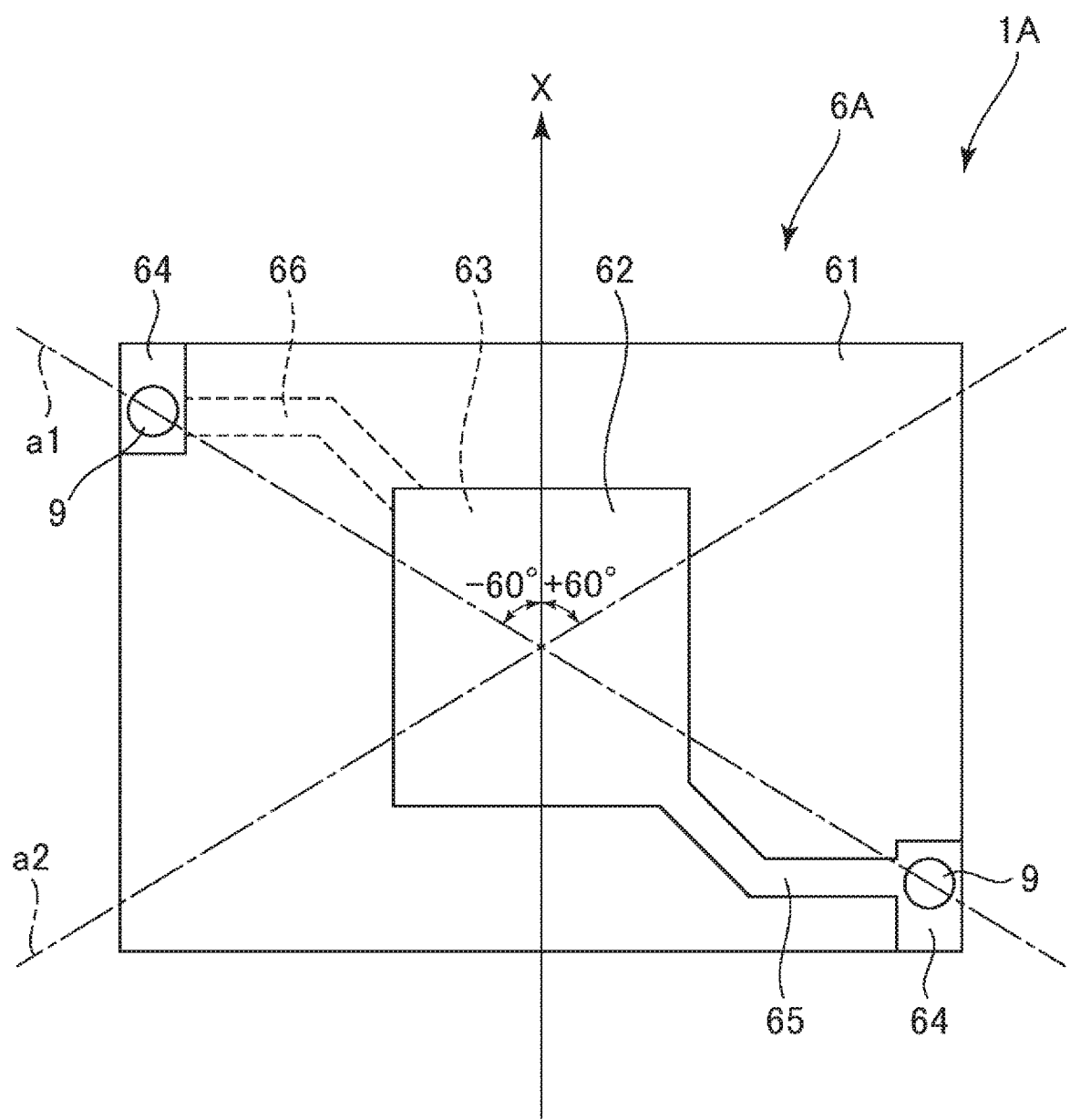
FIG. 8 is a plan view (view seen from −γ direction side) of a vibrator element provided in the vibrator device according to the second embodiment of the invention.
Figure 8:
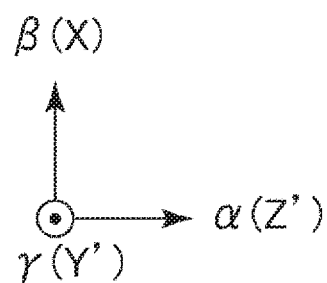

FIG. 7 is a plan view (view seen from −γ direction side) of a relay board provided in the vibrator device according to the second embodiment of the invention. FIG. 8 is a plan view (view seen from −γ direction side) of a vibrator element provided in the vibrator device according to the second embodiment of the invention.

Hereinafter, the vibrator device of the second embodiment will be described focusing on differences from the above-described first embodiment, and description of similar items will not be made.

The vibrator device according to the second embodiment of the invention is the same as the above-described first embodiment except that the numbers of the first metal bump and the second metal bump are different.

In the vibrator device 1 of the first embodiment described above, the support of the vibrator element 6 with respect to the relay board 5 is supported at four points. On the other hand, in a vibrator device 1A of this embodiment illustrated in FIGS. 7 and 8, a vibrator element 6A is provided instead of the vibrator element 6, and the support of the vibrator element 6A with respect to the relay board 5 is supported at two points, which is different from the vibrator device 1 of the first embodiment.

On the relay board 5, two terminals 52, two terminals 53, and two wirings 54 are arranged. The two terminals 52 are arranged at two corners at diagonal of the relay board 5 so that the metal bump 8 can be disposed at a position overlapping the line segment a1 in plan view. In addition, the terminal 53 is disposed so that the metal bump 9 can be disposed at a position overlapping the line segment a1 in plan view.

The vibrator element 6A is the same as the vibrator element 6 of the above-described first embodiment except that the pad electrode 64 not connected to the wirings 65 and 66 is not provided. In addition, the vibrator element 6 is bonded to the relay board 5 via the two metal bumps 9. Note that, instead of the vibrator element 6A, the vibrator element 6 of the first embodiment may be used.

According to the second embodiment as described above, similarly to the above-described first embodiment, the metal bumps 9 are arranged on the straight line a1 inclined within a range of +55° to +65° or −65° to −55° with respect to the X axis of the quartz crystal constituting the quartz crystal vibrator element 61 in plan view, and thus it is possible to reduce the fluctuations in the resonance frequency of a vibrator element 6A can be exhibited even if stress is generated in the vibrator element 6A due to the difference in the linear expansion coefficient between the base 2 and the vibrator element 6A, and the like. In this embodiment, since the support of the vibrator element 6A with respect to the relay board 5 is supported at two points, it is difficult for the vibrator element 6A to generate the stress in directions other than the direction along the straight line a1, and there is an advantage that the fluctuations in the resonance frequency of the vibrator element 6A can be easily reduced. In the drawing, the inclination angles of the straight lines a1 and a2 with respect to the X axis of the quartz crystal in plan view are −60° or +60°, respectively.

Third Embodiment

Next, a third embodiment of the invention will be described.

Figure 9:
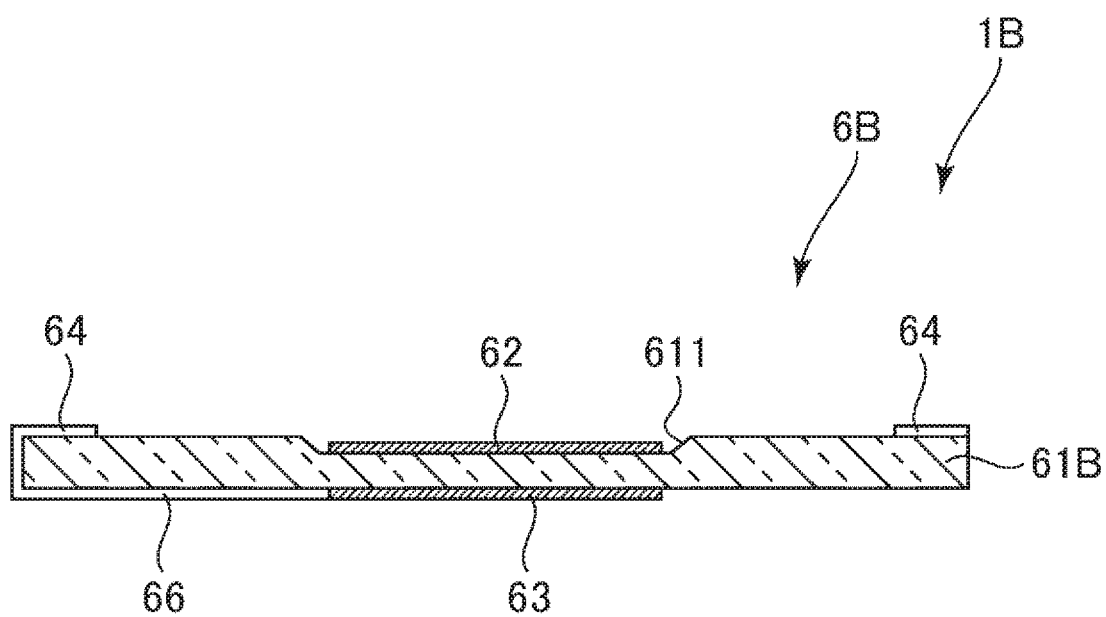
FIG. 9 is a sectional view (a sectional view along an αγ plane) of the vibrator element provided in the vibrator device according to the third embodiment of the invention.
Figure 10:
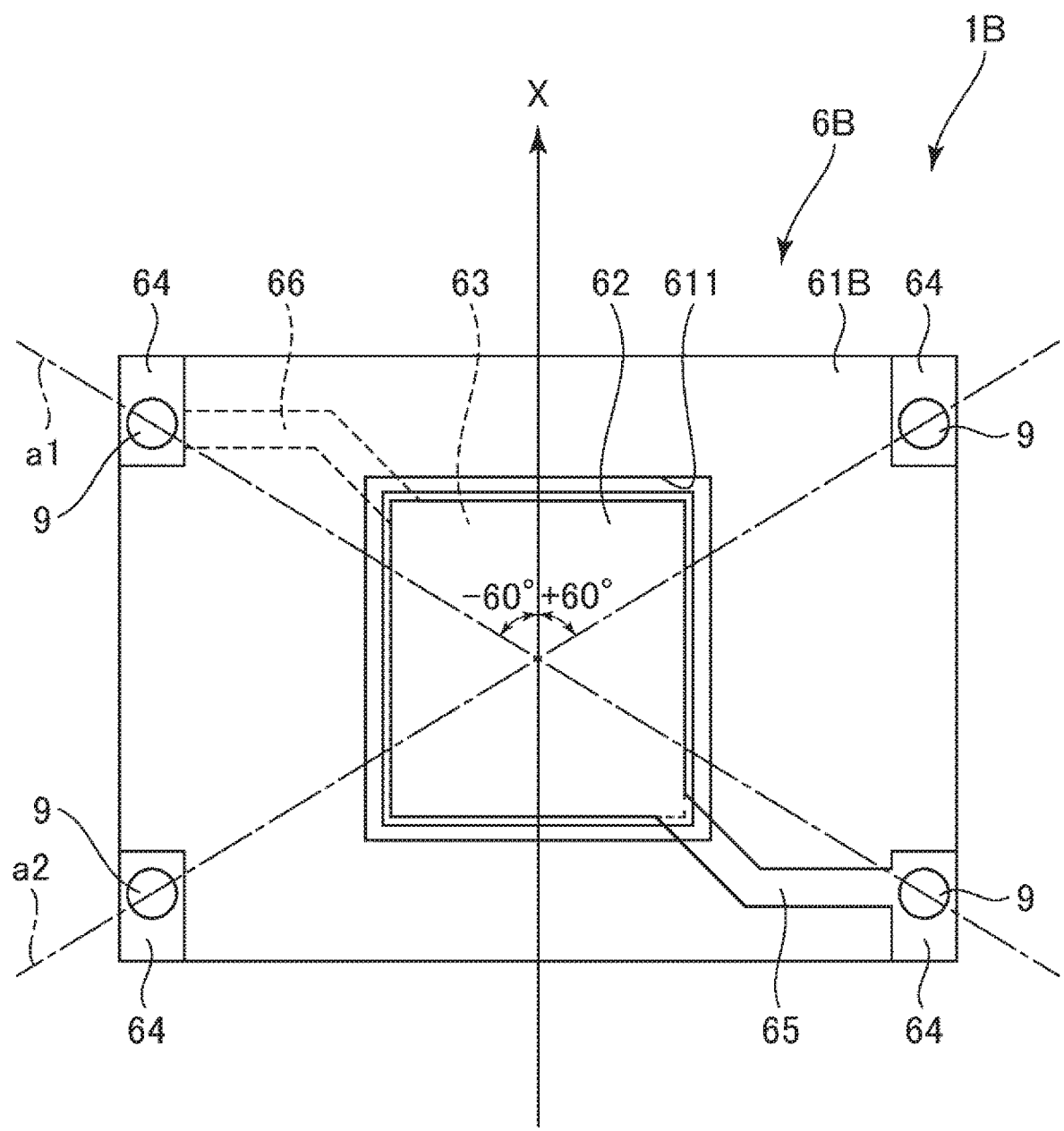
FIG. 10 is a plan view (view seen from +γ direction side) of the vibrator element as illustrated in FIG. 9.

FIG. 9 is a sectional view (a sectional view along an αγ plane) of the vibrator element provided in the vibrator device according to the third embodiment of the invention. FIG. 10 is a plan view (view seen from +γ direction side) of the vibrator element as illustrated in FIG. 9.

Hereinafter, the vibrator device of the third embodiment will be described focusing on differences from the above-described first embodiment, and description of similar items will not be made.

The vibrator device according to the third embodiment of the invention is the same as the above-described first embodiment except that the vibrator element is a so-called inverted mesa type.

The vibrator device 1B illustrated in FIG. 10 is provided with a vibrator element 6B instead of the vibrator element 6 of the first embodiment described above. The vibrator element 6B includes a quartz crystal vibrator element 61B having a recessed portion 611 on one surface, a pair of the excitation electrodes 62 and 63 arranged on both surfaces of a thin part by the recessed portion 611 of the quartz crystal vibrator element 61B, four pad electrodes 64 arranged on one surface (upper surface) of the quartz crystal vibrator element 61, and wirings 65 and 66 connected to the pair of excitation electrodes 62 and 63 and two pad electrodes 64.

According to the third embodiment as described above, similarly to the above-described first embodiment, the metal bumps 9 are arranged on the straight line a1 inclined at +60° or −60° with respect to the X axis of the quartz crystal constituting the quartz crystal vibrator element 61B in plan view, and thus it is possible to reduce the fluctuations in the resonance frequency of the vibrator element 6B can be exhibited even if stress is generated in the vibrator element 6B due to the difference in the linear expansion coefficient between the base 2 and the vibrator element 6B, and the like. In the drawing, the inclination angles of the straight lines a1 and a2 with respect to the X axis of the quartz crystal in plan view are +60° or −60°, respectively. Further, in this embodiment, since the quartz crystal vibrator element 61B is an inverted mesa type, there is an advantage that the thickness sliding vibration to be excited in the quartz crystal vibrator element 61B is hardly influenced by the position of the metal bump 9 and it is easy to reduce the size of the quartz crystal vibrator element 61B while maintaining desired characteristics. Note that, such advantages can also be obtained by using a mesa-type quartz crystal vibrator element. Also, in the drawing, the recessed portion 611 is provided on one side of the quartz crystal vibrator element 61B, and it is needless to say that the recessed portions may be provided on both sides of the quartz crystal vibrator element 61B.

Fourth Embodiment

Next, a fourth embodiment of the invention will be described.

Figure 11:
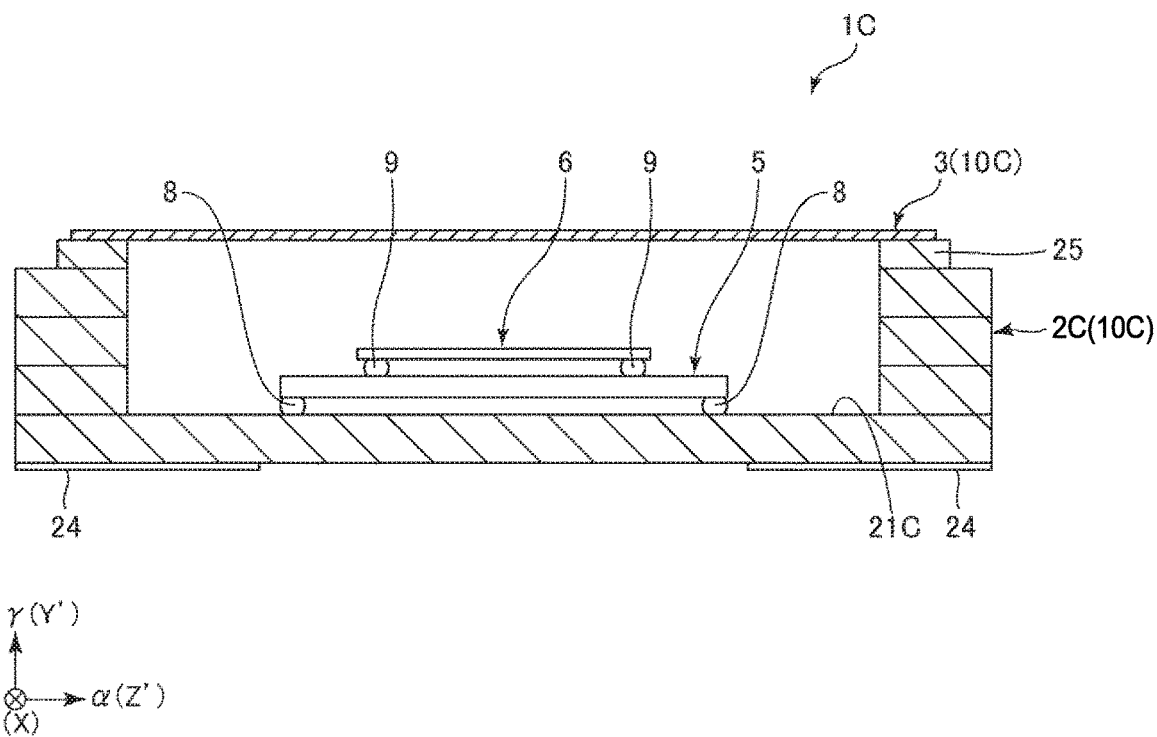
FIG. 11 is a longitudinal sectional view (a sectional view along an αγ plane) illustrating a vibrator device (vibrator) according to a fourth embodiment of the invention.

FIG. 11 is a longitudinal sectional view (a sectional view along an αγ plane) illustrating a vibrator device (vibrator) according to a fourth embodiment of the invention.

Hereinafter, the vibrator device of the fourth embodiment will be described focusing on differences from the above-described first embodiment, and description of similar items will not be made.

The vibrator device according to the fourth embodiment of the invention is the same as the above-described first embodiment except that the vibrator is mainly constituted without the circuit element.

A vibrator device 1C as illustrated in FIG. 11 is a vibrator. The vibrator device 1C is provided with a base 2C (base body), a lid 3, a relay board 5, a vibrator element 6, metal bumps 8 and 9.

Here, an opening of a recessed portion 21C of the base 2C is closed by the lid 3, and the base 2C and the lid 3 constitute a package 10C having a space S storing the relay board 5, and the vibrator element 6. In the space S of this package 10C, the relay board 5, and the vibrator element 6 are arranged (stacked) in this order from the −γ direction side to the +γ direction side.

The metal bump 8 (second metal bump) bonds the base 2C and the relay board 5, and the relay board 5 is attached to the base 2C via the metal bump 8. The metal bump 9 (first metal bump) bonds the relay board 5 and the vibrator element 6, and the vibrator element 6 is attached to the relay board 5 via the metal bump 9.

According to the fourth embodiment as described above, similarly to the above-described first embodiment, the metal bumps 9 are arranged on the straight line inclined within a range of +55° to +65° or −65° to −55° with respect to the X axis of the quartz crystal constituting the quartz crystal vibrator element of the vibrator element 6 in plan view, and thus it is possible to reduce the fluctuations in the resonance frequency of a vibrator element 6 can be exhibited even if stress is generated in the vibrator element 6 due to the difference in the linear expansion coefficient between the base 2 and the vibrator element 6, and the like. In the vibrator device 1C which is the vibrator, the circuit element 4 of the above-described first embodiment may be installed outside the package 10C to constitute an oscillator.

4. Electronic Apparatus

Next, an electronic apparatus according to the invention will be described.

Figure 12:
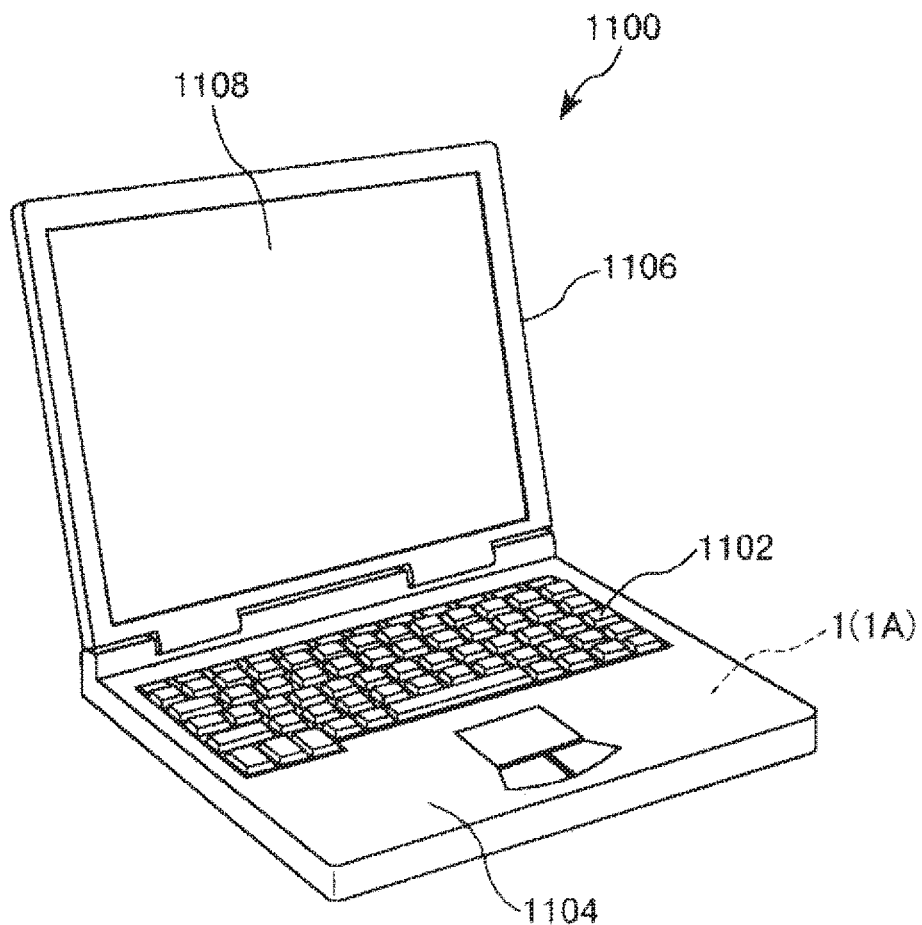
FIG. 12 is a perspective view illustrating a configuration of a mobile type (or notebook type) personal computer which is an example of an electronic apparatus according to the invention.

FIG. 12 is a perspective view illustrating a configuration of a mobile type (or notebook type) personal computer which is an example of an electronic apparatus according to the invention. In FIG. 12, a personal computer 1100 is configured to include a main body portion 1104 provided with a keyboard 1102 and a display unit 1106 provided with a display portion 1108, and the display unit 1106 is configured to be pivotably attached around the main body portion 1104 via a hinge structure portion. A vibrator device 1 (or 1A, 1B, or 1C) functioning as a filter, a resonator, a reference clock, or the like is built in the aforementioned personal computer 1100.

Figure 13:
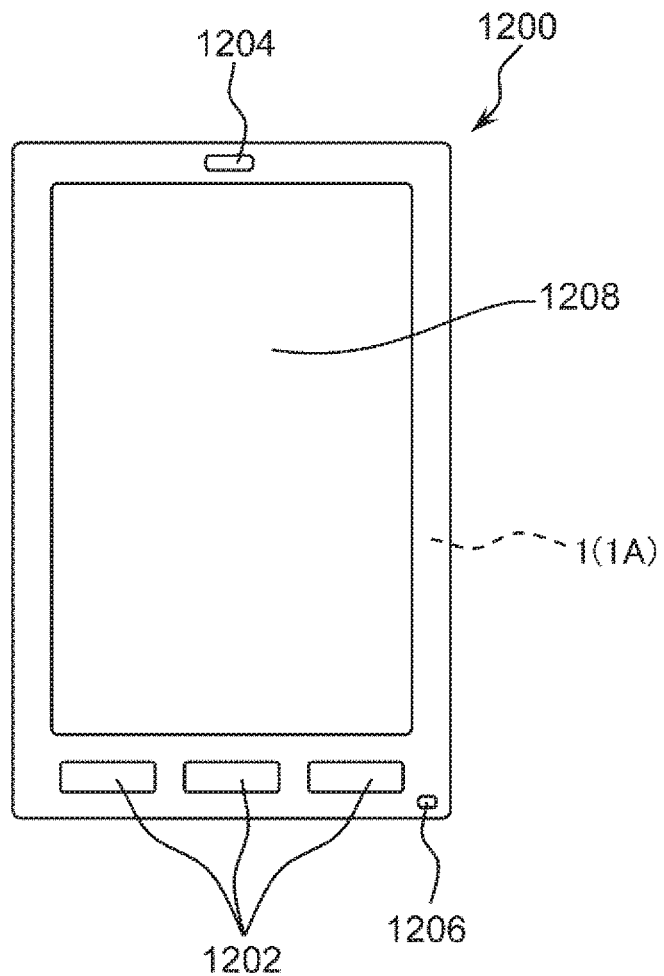
FIG. 13 is a perspective view illustrating a configuration of a smartphone which is an example of the electronic apparatus according to the invention.

FIG. 13 is a perspective view illustrating a configuration of a smartphone which is an example of the electronic apparatus according to the invention. In FIG. 13, a mobile phone 1200 is provided with a plurality of operation buttons 1202, an earpiece 1204, and a mouthpiece 1206, and a display portion 1208 is disposed between the operation button 1202 and the earpiece 1204. A vibrator device 1 (or 1A, 1B, or 1C) functioning as a filter, a resonator, or the like is built in the aforementioned mobile phone 1200.

Figure 14:
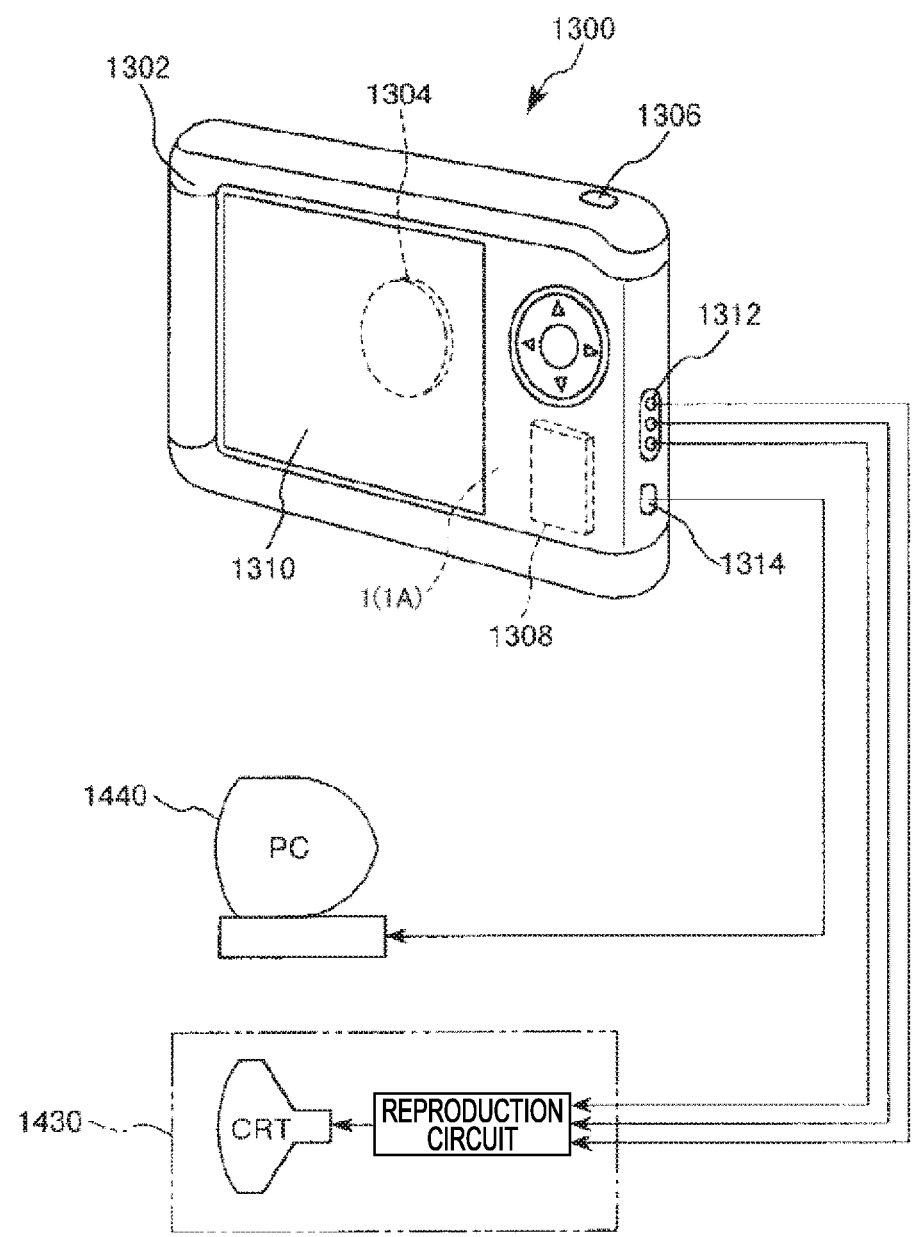
FIG. 14 is a perspective view illustrating a configuration of a digital still camera which is an example of the electronic apparatus according to the invention.

FIG. 14 is a perspective view illustrating a configuration of a digital still camera which is an example of the electronic apparatus according to the invention. Note that, connection with an external device is also briefly illustrated in FIG. 14. A display portion 1310 is provided on a rear surface of a case (body) 1302 of the digital still camera 1300, and is configured to perform display based on imaging signals of the CCD, and the display portion 1310 functions as a viewfinder displaying a subject as an electronic image. A light receiving unit 1304 including an optical lens (imaging optical system) and a CCD or the like is provided on the front side (back side in the drawing) of the case 1302.

When the photographer confirms a subject image displayed on the display portion 1310 and presses a shutter button 1306, the imaging signal of the CCD at that time is transferred and stored in a memory 1308. In the digital still camera 1300, a video signal output terminal 1312 and an input and output terminal 1314 for data communication are provided on the side surface of the case 1302. As illustrated in FIG. 14, a television monitor 1430 is connected to the video signal output terminal 1312, and a personal computer 1440 is connected to the input and output terminal 1314 for data communication, as necessary. Further, the imaging signal stored in the memory 1308 is output to the television monitor 1430 or the personal computer 1440 by a predetermined operation. A vibrator device 1 (or 1A, 1B, or 1C)

functioning as a filter, a resonator, or the like is built in the aforementioned digital still camera 1300.

The above-described electronic apparatus is provided with the vibrator device 1, 1A, 1B, or 1C. According to such an electronic apparatus, the characteristics of the electronic apparatus can be improved by using excellent characteristics of the vibrator device 1, 1A, 1B, or 1C.

Note that, the electronic apparatus provided with the vibrator device according to the invention can be applied to, for example, a watch, a tablet terminal, an ink jet type discharging apparatus (for example, an ink jet printer), a laptop personal computer, TV, a video camera, a video tape recorder, a car navigation device, a pager, an electronic notebook (including a communication function), an electronic dictionary, a calculator, an electronic game machine, a word processor, a work station, a video phone, a security monitor for television, electronic binoculars, a POS terminal, medical equipment (such as an electronic clinical thermometer, a blood pressure monitor, a blood glucose meter, an electrocardiogram measuring device, an ultrasonic diagnostic device, and an electronic endoscope), a fish finder, various measuring instruments, meters and gauges (such as meters and gauges for a vehicle, an aircraft, and a ship), a flight simulator, in addition to the personal computer (mobile type personal computer) of FIG. 12, the smartphone (mobile phone) of FIG. 13, the digital still camera of FIG. 14.

5. Vehicle

Next, a vehicle (vehicle according to the invention) to which the vibrator device according to the invention is applied will be described.

Figure 15:
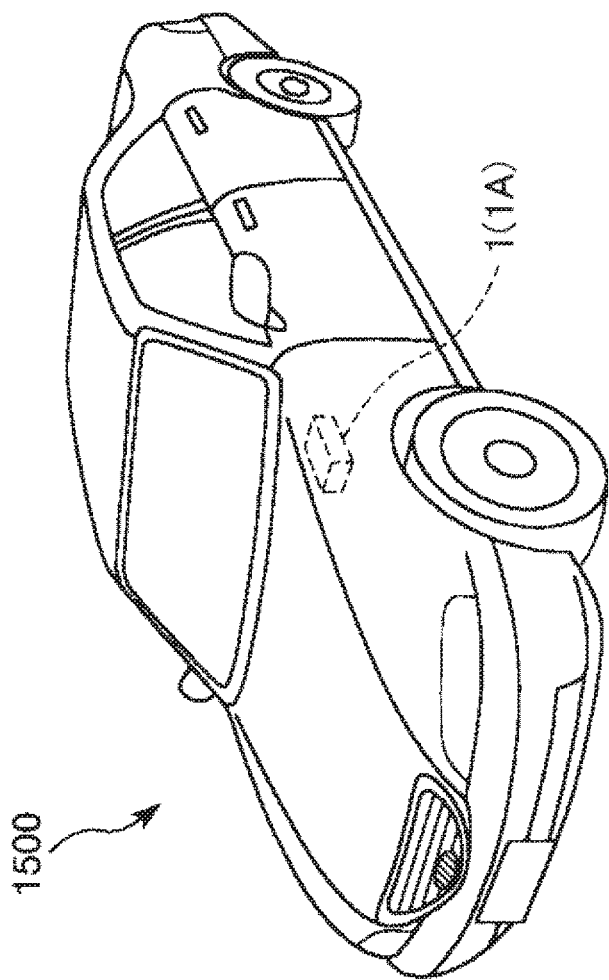
FIG. 15 is a perspective view illustrating an automobile which is an example of a vehicle according to the invention.

FIG. 15 is a perspective view illustrating an automobile which is an example of the vehicle according to the invention. A vibrator device 1 (or 1A, 1B, or 1C) is mounted on an automobile 1500. The vibrator device 1 (or 1A, 1B, or 1C) can be applied to an electronic control unit (ECU) such as keyless entry, an immobilizer, a car navigation system, a car air conditioner, an anti-lock brake system (ABS), an air bag, a tire pressure monitoring system (TPMS), engine control, a battery monitor of a hybrid car and an electric vehicle, and a vehicle body attitude control system.

The automobile 1500 which is the above-described vehicle is provided with the vibrator device 1, 1A, 1B, or 1C. According to such an automobile 1500, the characteristics of the automobile 1500 can be improved by using excellent characteristics of the vibrator device 1, 1A, 1B, or 1C.

Although the vibrator device, the electronic apparatus, and the vehicle according to the invention have been described based on the embodiments illustrated in the drawings; however, the invention is not limited thereto, and the configuration of each portion can be replaced by optional configuration having the same functions. Further, any other constituent may be added to the invention. Further, each of the above-described embodiments may be appropriately combined.

The entire disclosure of Japanese Patent Application No. 2017-248837, filed Dec. 26, 2017 is expressly incorporated by reference herein.

What is claimed is:

1. A vibrator device, comprising:
   a base;
   a vibrator element including a quartz crystal vibrator element attached to the base via two first metal bumps; and
   a relay board attached to the base via two second metal bumps,
   a vibrator element including a quartz crystal vibrator element attached to the base via two first metal bumps,
   wherein the two first metal bumps are disposed on a straight line inclined within a range of +55° to +65° or −65° to −55° with respect to an X axis, which is an electric axis of a quartz crystal constituting the quartz crystal vibrator element in plan view seen from a direction in which the base and the quartz crystal vibrator element are arranged,
   wherein the vibrator element is attached to the base via the relay board and the two second metal bumps, and
   wherein the two second metal bumps are disposed on the straight line in plan view.

2. The vibrator device according to claim 1, wherein the quartz crystal vibrator element is an AT-cut quartz crystal board.

3. The vibrator device according to claim 2, wherein the quartz crystal vibrator element has an elongated shape whose longitudinal direction is the direction along a Z axis of the quartz crystal in plan view.

4. The vibrator device according to claim 1, further comprising:
   a circuit element attached to the base via a third metal bump,
   wherein the vibrator element is attached to the base via the relay board, the two second metal bumps, the third metal bump, and the circuit element.

5. The vibrator device according to claim 4, wherein the two second metal bumps do not overlap the third metal bump in plan view.

6. The vibrator device according to claim 1, wherein the two second metal bumps do not overlap the two first metal bumps in plan view.

7. An electronic apparatus provided with the vibrator device according to claim 1.

8. A vehicle provided with the vibrator device according to claim 1.

* * * * *